(12) United States Patent
Trivedi et al.

(10) Patent No.: US 9,098,664 B2
(45) Date of Patent: *Aug. 4, 2015

(54) INTEGRATED CIRCUIT OPTIMIZATION

(71) Applicant: JUNIPER NETWORKS, INC., Sunnyvale, CA (US)

(72) Inventors: Vivek Trivedi, Fremont, CA (US); Khalil Siddiqui, San Jose, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/194,129

(22) Filed: Feb. 28, 2014

(65) Prior Publication Data

US 2014/0181778 A1   Jun. 26, 2014

Related U.S. Application Data

(63) Continuation of application No. 13/192,609, filed on Jul. 28, 2011, now Pat. No. 8,683,416.

(51) Int. Cl.
*G06F 17/50* (2006.01)

(52) U.S. Cl.
CPC .......... *G06F 17/505* (2013.01); *G06F 17/5068* (2013.01); *G06F 17/5072* (2013.01)

(58) Field of Classification Search
USPC .................. 716/126, 129, 130, 132
See application file for complete search history.

(56) References Cited

U.S. PATENT DOCUMENTS

| | | | |
|---|---|---|---|
| 4,615,011 A | 9/1986 | Linsker | |
| 4,823,276 A | 4/1989 | Hiwatashi | |
| 4,910,680 A | 3/1990 | Hiwatashi | |
| 5,255,156 A | 10/1993 | Chang | |
| 5,295,082 A | 3/1994 | Chang et al. | |
| 5,557,564 A | 9/1996 | Haraguchi et al. | |
| 5,583,788 A | 12/1996 | Kuribayashi | |
| 5,789,770 A | 8/1998 | Rostoker et al. | |
| 7,295,037 B2 | 11/2007 | Schmit et al. | |
| 8,683,416 B1 * | 3/2014 | Trivedi et al. | 716/130 |

OTHER PUBLICATIONS

Co-pending U.S. Appl. No. 13/192,609, filed Jul. 28, 2011, entitled "Integrated Circuit Optimization" by Vivek Trivedi et al., 50 pages.

* cited by examiner

*Primary Examiner* — Sun Lin
(74) *Attorney, Agent, or Firm* — Harrity & Harrity, LLP

(57) ABSTRACT

A device may identify signal channels for connecting circuit blocks, where each circuit block is associated with a block implementation area corresponding to a substrate. The device may assign a channel priority to each of the signal channels based on at least one channel criteria. The device may allocate a channel implementation area, corresponding to the substrate, for each of a plurality of signal channels, based on the channel priority assigned to the signal channel and based on the block implementation areas. The device may generate an integrated circuit design comprising the channel implementation area allocated for each of the plurality of signal channels.

20 Claims, 11 Drawing Sheets

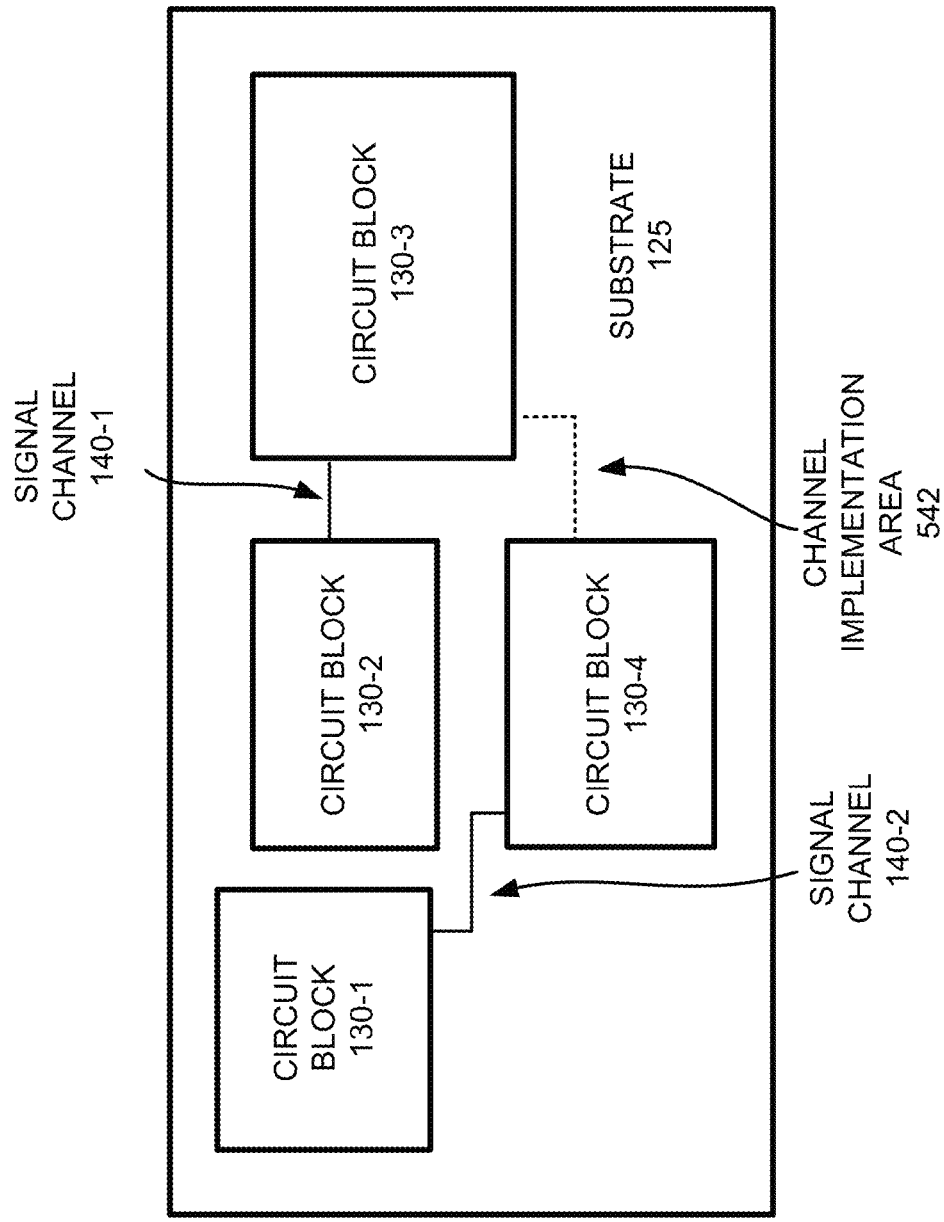

FIG. 7

| SIGNAL CHANNELS | | FUNCTIONAL PRIORITY | USE PRIORITY | OVERALL PRIORITY |
|---|---|---|---|---|
| BLOCK 130-1 | ↔ BLOCK 130-4 | 1 | 1 | 1 |
| BLOCK 130-2 | ↔ BLOCK 130-3 | 2 | 2 | 2 |
| BLOCK 130-3 | ↔ BLOCK 130-4 | 2 | 3 | 3 |
| ⋮ | ↔ ⋮ | ⋮ | ⋮ | ⋮ |

700

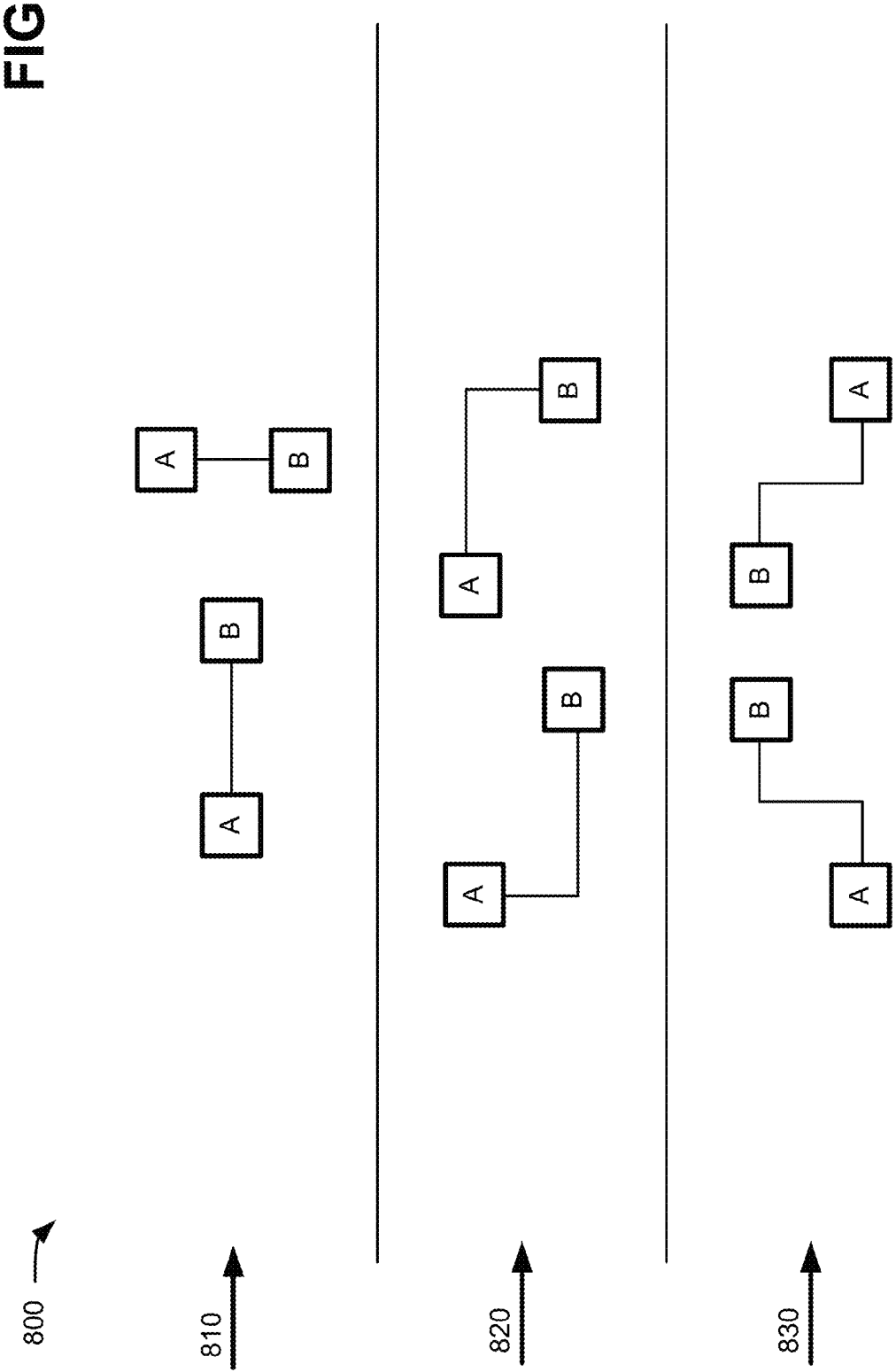

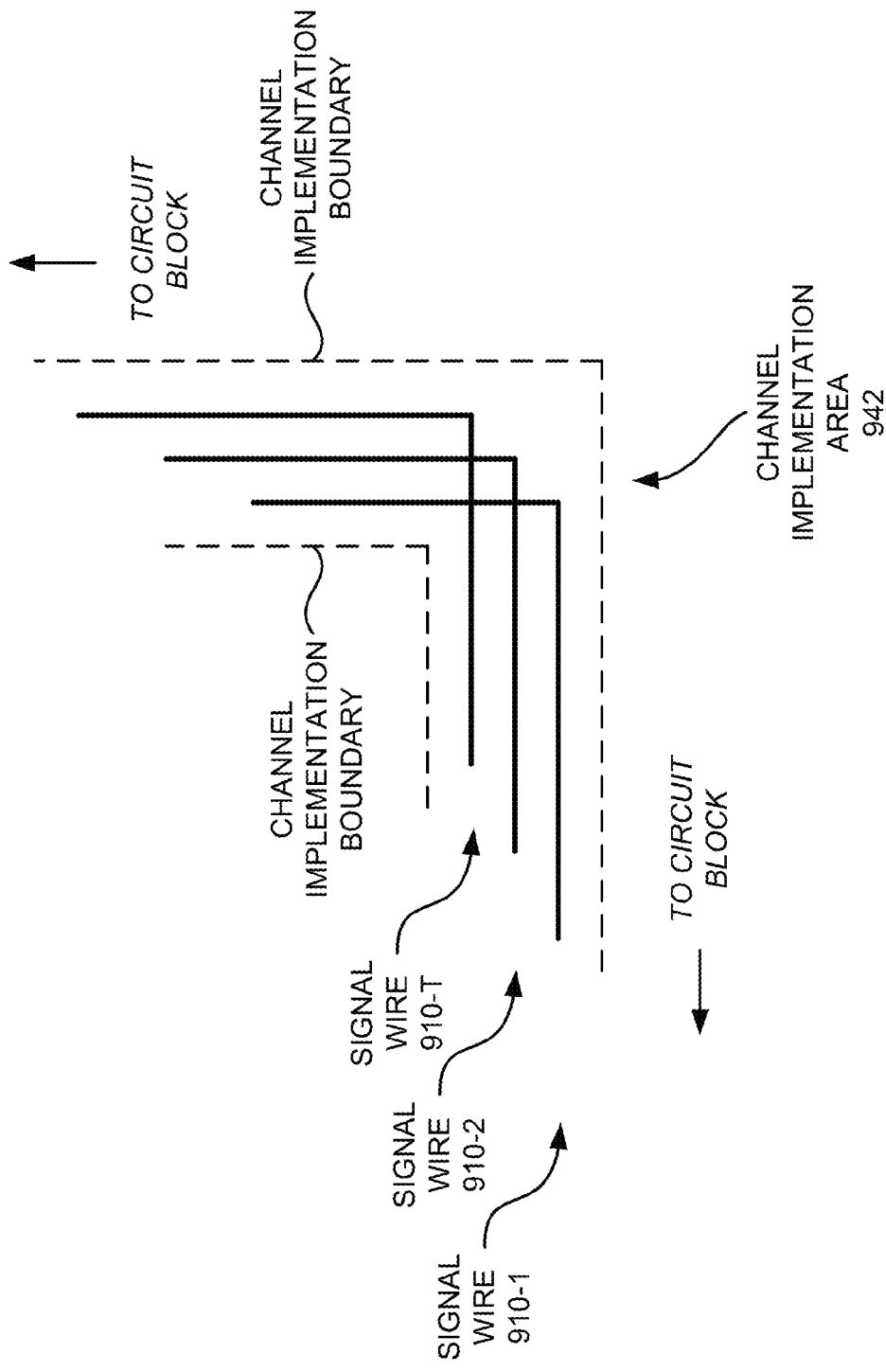

INTEGRATED CIRCUIT OPTIMIZATION

RELATED APPLICATION

This application is a continuation of U.S. patent application Ser. No. 13/192,609, filed Jul. 28, 2011, now U.S. Pat. No. 8,683,416, which is incorporated herein by reference.

BACKGROUND

Integrated circuits (ICs) are a common component of electronic devices. The wide-spread use of ICs is due, at least in part, to the flexibility, in form and in function, with which ICs may be implemented. Nevertheless, currently available ICs often include one or more of a variety of deficiencies. For example, ICs (especially high-performance ICs) often include an arrangement of blocks and signal channels that contributes to unreliable and/or inefficient performance due to inductive noise, latency, and other types of undesirable phenomena.

SUMMARY

According to one aspect, a method may include identifying, by a device, signal channels for connecting circuit blocks, where each circuit block is associated with a block implementation area corresponding to a substrate; assigning, by the device, a channel priority to each signal channel based on at least one channel criteria; allocating, by the device, a channel implementation area, corresponding to the substrate, for each of signal channels, based on the channel priority assigned to the signal channel and based on the block implementation areas; and generating, by the device, an integrated circuit design comprising the channel implementation area allocated for each of the signal channels.

According to another aspect, a device may include a memory to store instructions and a processor connected to the memory. The processor may identify signal channels for connecting circuit blocks, where each of the circuit blocks is associated with a block implementation area corresponding to a substrate, prior to allocation of port implementation areas for the circuit blocks, assign a channel priority to each of the signal channels based on at least one channel criteria, select a first signal channel from the signal channels, the first signal channel corresponding to a first channel priority, allocate a first channel implementation area, corresponding to the substrate, for the first signal channel, where the first channel implementation area is allocated based on the block implementation areas, select a second signal channel from the signal channels, the second signal channel corresponding to a second channel priority, allocate a second channel implementation area, corresponding to the substrate, for the second signal channel, where the second channel implementation area is allocated based on the block implementation areas and the first channel implementation area, and generate an integrated circuit design comprising the first channel implementation area and the second channel implementation area allocated for the first and the second signal channels, respectively.

According to yet another aspect, a non-transitory computer-readable medium storing a program for causing a device to perform a method that may include identifying signal channels for connecting circuit blocks, where each of the circuit blocks is associated with a block implementation area corresponding to a substrate; prior to allocation of port implementation areas for the circuit blocks, assigning a channel priority to each of the signal channels based on at least one channel criteria; allocating a channel implementation area, corresponding to the substrate, for each of the signal channels, based on the channel priority assigned to the signal channel and based on the block implementation areas; and generating an integrated circuit design comprising the channel implementation area allocated for each of the signal channels.

BRIEF DESCRIPTION OF THE DRAWINGS

FIGS. 5A-5C are example diagrams of an integrated circuit according to one or more implementations described herein;

FIG. 7 is a diagram of an example data structure for prioritized signal channels according to one or more implementations described herein;

FIG. 8 is a diagram of example channel patterns according to one or more implementations described herein; and FIG. 9 is a diagram of example signal wires according to one or more implementations described herein.

DETAILED DESCRIPTION

The following detailed description refers to the accompanying drawings. The same labels and/or reference numbers in different drawings may identify the same or similar elements.

In one or more implementations, described herein, systems and devices may be used to design and manufacture integrated circuits in a manner that enhances integrated circuit performance and reliability. For example, a computing device may identify signal channels for connecting circuit blocks, where each circuit block is associated with a circuit block implementation area relative to a substrate. The computing device may assign a channel priority to each of the signal channels, based on one or more channel criteria, and allocate a first channel implementation area for the signal channel with the highest priority. The first channel implementation area may include a shortest available path between the circuit block implementation areas.

The computing device may select the signal channel with the second highest priority and allocate a second channel implementation area for the signal channel with the second highest priority. Similar to the first channel implementation area, the second channel implementation area may include a shortest available path based on the circuit block implementation areas. However, the second channel implementation may also be based on the first channel implementation area previously allocated to the signal channel with the highest priority. In a similar manner, the computing device may allocate channel implementation areas for each of the remaining signal channels.

Figure 1:
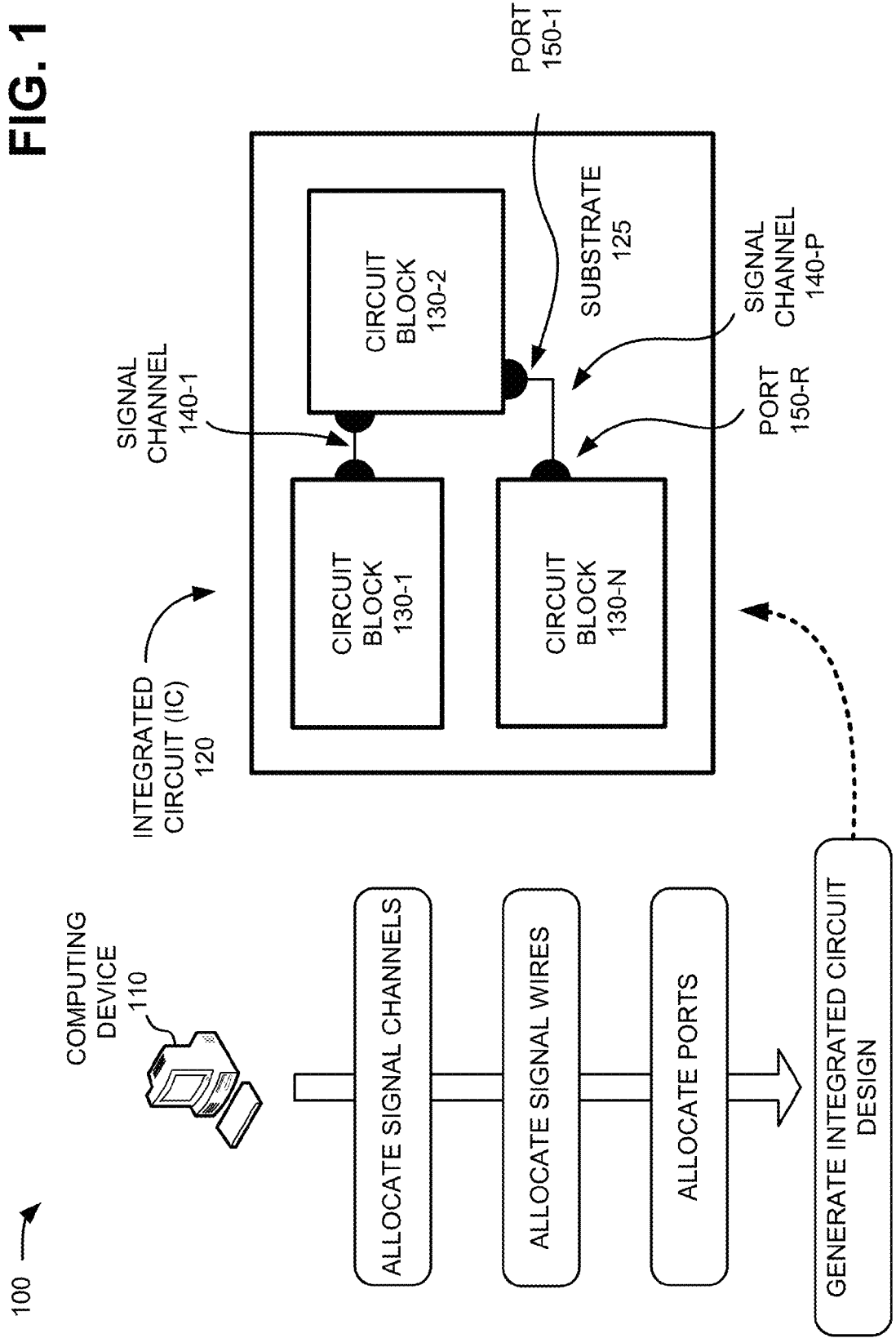
FIG. 1 is a diagram of an example overview of an implementation described herein.

The computing device may also, or alternatively, identify a quantity of signal wires corresponding to each signal channel and select a wire pattern for each signal wire. The wire pattern may be selected to equalize a wire length (or a transmission time) associated with each signal wire of a given signal channel. The wire pattern may also, or alternatively, be based on one or more channel implementation areas previously allocated to the corresponding signal channel. The computing device may allocate a wire implementation area for each signal wire. The computing device may also, or alternatively, identify one or more sets of ports corresponding to each signal channel or set of signal wires, and allocate port implementation areas for each of the identified ports. The computing device may generate an integrated circuit design that includes the circuit block implementation areas, channel implementation areas, wire implementation areas, and/or port implementation areas. Accordingly, in one or more implementations described herein, a bottom-up approach to integrated circuit design may be implemented to enhance performance efficiency and reliability by minimizing inductive noise, latency, and other types of undesirable phenomena FIG. 1 is a diagram of an example overview 100 of an implementation described herein. As depicted, overview 100 may include a computing device 110, integrated circuit (IC) 120, substrate 125, circuit blocks 130-1, 130-2, . . . , 130-N (where N≥1) (collectively referred to as "circuit blocks 130," and individually as "circuit block 130"), signal channels 140-1, . . . , 140-P (where P≥1) (collectively referred to as "signal channels 140," and individually as "signal channel 140"), and ports 150-1, . . . , 150-R (where R≥1) (collectively referred to as "ports 150," and individually as "port 150"). In some implementations, the systems and devices of FIG. 1 may correspond to one or more systems or devices discussed elsewhere in this specification.

Computing device 110 may include one or more computation or communication devices that gather, process, search, store, and/or provide information in a manner similar to that described herein. Computing device 110 may be a computer device, a mobile computing device (e.g., a laptop computer), and/or another type of computation or communication device. The description to follow will generally refer to computing device 110 as a computer device; however, the description is not limited to a computer device and may equally apply to other types of electronic devices. As depicted, computing device 110 may generate an IC design by performing one or more functions, processes, and/or operations relating to the allocation of signal channels, the allocation of signal wires, and/or the allocation of ports. As depicted in FIG. 1 and described throughout this specification, computing device 110 may generate an integrated circuit design by, for example, allocating signal channels 140 based on allocated circuit blocks 130, allocate signal wires based on allocated signal channels 140, and allocate ports 150 based on allocated signal wires.

Integrated circuit (IC) 120 may include a microprocessor, a field programmable gate array (FPGA), a printed circuit board, an application specific IC (ASIC), a memory device (e.g., random access memory (RAM), read only memory (ROM), flash memory, etc.), and/or one or more other types of circuits, devices, or components. As depicted, IC 120 may include one or more substrates 125, one or more circuit blocks 130, one or more signal channels 140, and/or one or more ports 150. Additionally, or alternatively, while IC 120 is depicted two dimensionally, IC 120 and/or one or more of the components 125-150 of IC 120 may be three dimensional structures.

Substrate 125 may include any material on which IC 120 and/or a component of IC may be installed. For example, substrate 125 may be a semiconductor material configured to enable IC components to be installed, such as a silicon chip, a germanium chip, a gallium arsenide chip, and/or another semiconductor material. In some implementations, substrate 125 may include an insulator material, a conductive material, a circuit board, a breadboard, and/or one or more other types of materials. Although a number of different substrate materials and configurations are discussed above, in the description to follow, substrate 110 will be described as a silicon chip.

Circuit block 130 may be a region on substrate 125 that may include electrical components (e.g., transistors, resistors, inductors, capacitors, wires, etc.), logical components (e.g., logic gates, flip flops, etc.) and/or other components, such as amplifiers, input/output (I/O) devices, etc. Circuit block 130 may be partitioned to perform a particular function or set of functions for IC 120. For example, circuit block 130 may include a CPU, wires to connect to/from the CPU, logic gates to control the CPU, etc. In another example, circuit block 130 may include a memory device or group of memory devices (e.g., RAM, ROM, registers, flip flops, etc.) and may include wires to connect to/from the memory devices and/or logic gates to control read functions, write functions and/or other functions associated with circuit block 130. In some examples, circuit block 130 may include other devices that perform other functions for IC 120. Circuit block 130 may be connected to other circuit blocks 130 and/or other components on IC 120, such as a source clock, a power source, or another type of IC component.

Signal channel 140 may include one or more paths and/or one or more other types of connectors or connections for communicating information (e.g., signals) between circuit blocks 130. In some implementations, signal channel 140 may include one or more signals wires. As depicted, signal channels 140 may vary in length and design. For instance, comparing signal channel 140-1 with signal channel 104-P, signal channel 140-1 includes a straight and relatively short path between circuit block 130-1 and circuit block 130-2, while signal channel 140-P includes a longer path forming a right angle between circuit block 130-2 and circuit block 130-N. As illustrated, signal channels 140 may connect to ports 150 of circuit blocks 130. Port 150 may include a point of ingress for signals received by circuit block 130 and/or a point of egress for signals sent by circuit block 130.

Figure 2:
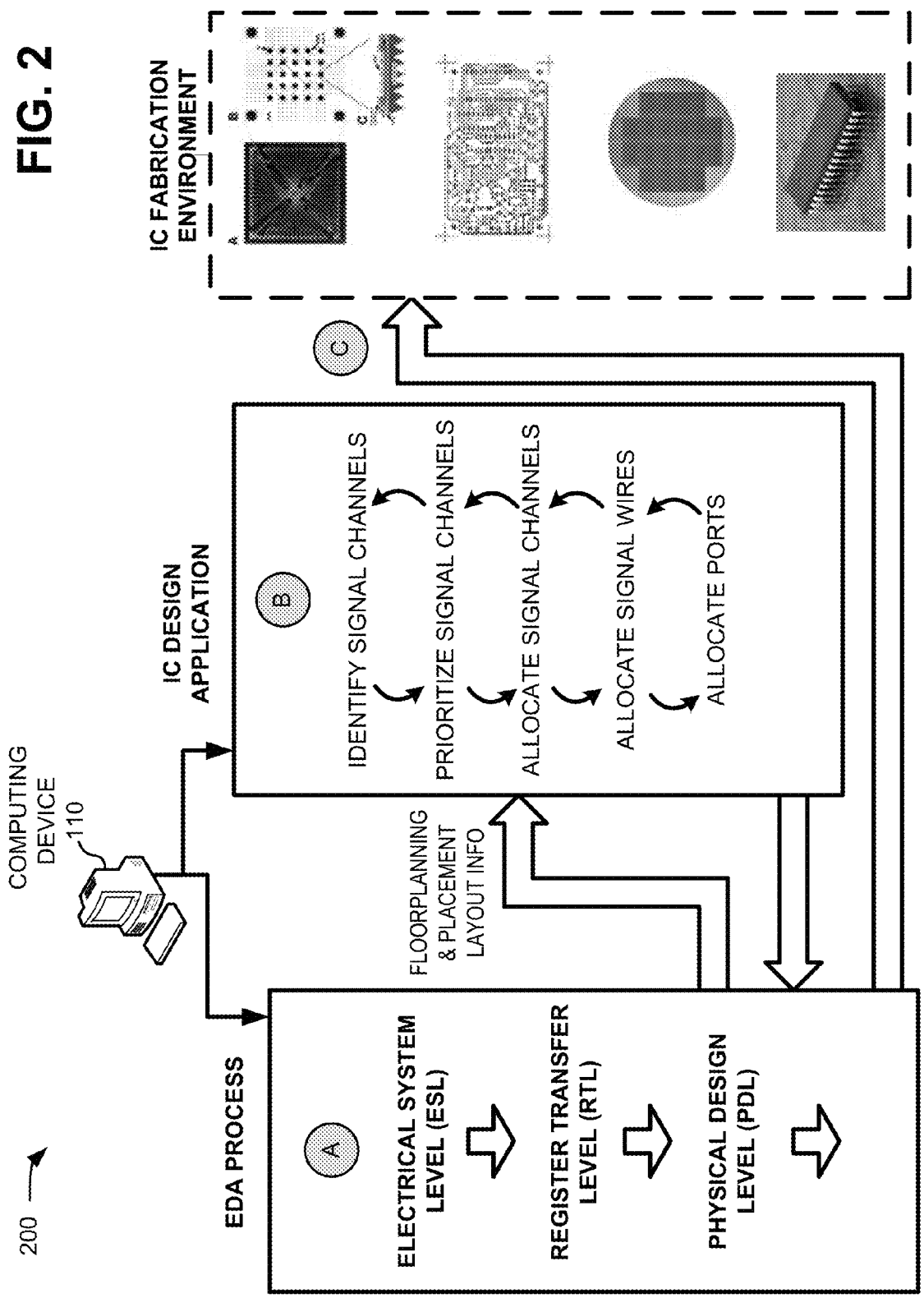
FIG. 2 is a diagram of an example environment in which systems and/or methods, described herein, may be implemented.

FIG. 2 is a diagram of an example environment 200 in which systems and/or methods, described herein, may be implemented. As illustrated, environment 200 may include computing device 110 and an IC fabrication environment. While FIG. 2 shows a particular number and arrangement of systems and devices, in alternative implementations, environment 200 may include additional systems or devices, fewer systems or devices, different systems or devices, or differently arranged systems or devices than those depicted in FIG. 2.

In addition to the description provided above with reference to FIG. 1, computing device 110 may store one or more applications associated with IC design. Computing device 110 may interface with an IC fabrication environment and may perform operations associated with IC design and/or IC fabrication as described herein. In some implementation, computing device 110 may interface with one or more additional or alternative computing devices 110 to perform operations associated with IC design and/or IC fabrication.

Computing device 110 may host a design application and/or other IC design tools, such as design tools (e.g., placement and routing (PNR) tools, register transfer level tools, static timing analysis tools, etc.) associated with the electronic design automation process (hereinafter referred to as the "EDA process"). The design application and/or other IC design tools, associated with the EDA process, may generate IC design information, which computing device 110 may send to the IC fabrication environment.

The EDA process may include an electrical system level (ESL) phase, a register transfer level (RTL) phase, a physical design level (PDL) phase, and/or one or more other types of design phases. While FIG. 2 illustrates the EDA process as including the ESL phase, the RTL phase, and the PDL phase, in other implementations, fewer phases, different phases, additional phases, or differently arranged phases may be associated with the EDA process.

One or more EDA phases may include a number of design stages and/or operations that may be performed automatically (e.g., by a design automation tool), heuristically (e.g., based on designer experience, empirical methods, and/or designer judgment) and/or manually. The ESL phase may include receiving customer requirements and generating a specification for IC 120 that addresses the customer requirements. The RTL phase may include developing, from the specification, a logical description of the operation and/or behavior of IC 120 that can, at a later point, be implemented by hardware components and/or software. Additionally, or alternatively, an RTL description may describe how signals within IC 120 travel between registers and/or other IC components to execute the logical description.

The PDL phase may include a number of design stages that generate an IC design that can be fabricated and/or that can execute the RTL logical description in conformance with the specification. For example, the PDL phase may include a floorplanning stage, a logic synthesis stage, a placement stage, a clock insertion stage, a routing stage, etc. The floorplanning stage may include dividing the chip into regions and/or a set of blocks (e.g., circuit blocks) in which various IC components may be placed to execute the RTL (e.g., I/O pads, arrays, central processing units (CPUs), logic circuits, memory components, registers, etc.). The logic synthesis stage may include generating a gate-level netlist of components that may execute the operations required by the RTL. The placement stage may include generating placement layout information corresponding to the specific location that logic gates and/or other components, identified in the netlist, may be integrated into circuit blocks and/or regions defined in the floorplanning stage. The placement layout information may include component location information that may minimize wire length, temperature gradients and/or power consumption associated with components installed in IC 120.

The clock insertion stage may include a number of operations that enable the insertion of a clock distribution network, within IC 120, in a manner that minimizes clock skew and/or clock latency. The clock distribution network may include a clock mesh, a clock mesh buffer, local clock buffers, H-trees and/or routing wires to connect components identified in the placement layout information, to the H-tree so that clock signal inputs may be received. The clock insertion stage will be further discussed below.

The routing stage may include inserting wires to interconnect the logic gates, identified in the netlist, located in circuit block 130 and/or located on IC 120 with components installed during the floorplanning stage. Care may be taken during the routing stage to ensure that the routing can be reproduced in the fabrication environment.

While the PDL phase is described above as including a floorplanning stage, a logic synthesis stage, a placement stage, a clock insertion stage, and a routing stage, in other implementations, fewer stages, different stages, additional stages or differently arranged stages may be associated with the PDL phase. Additionally, or alternatively, the manner in which the design stages, associated with the PDL phase, are performed may, in other implementations, be modified from that discussed herein. For example, the order of the design stages may be changed, the execution of one or more operations may be repeated, one or more design stages may not be executed, and/or one or more design stages may be performed in an iterative manner.

In some implementations, one or more operations may be performed, during one or more of the foregoing stages of the PDL phase. For example, during the placement stage, the IC design application may identify signal channels for connecting circuit blocks and prioritize the signal channels based on one or more channel criteria. The IC design application may also, or alternatively, allocate prioritized signal channels 140 based on an allocation of the circuit blocks 130, allocate signal wires based on the allocation of the signal channels 140, and allocate one or more ports 150 based on the allocation of the signal channels 140 and/or the allocation of the signal wires. In certain implementations, information representing one or more of the foregoing allocations may be used by computing device 110 to generate an IC design.

The IC design may be sent to the fabrication environment. For example, a routing stage may be performed, by a design tool associate with the EDA process (e.g., a PNR tool and/or some other design tool), to connect the logic gates to components to be installed on the IC. The IC design information may be sent, by computing device 110, to an IC fabrication environment. In the fabrication environment, the components, gates, wires, blocks, etc., may be fabricated onto a monolithic substrate (e.g., usually a semiconductor chip made of silicon, germanium or gallium arsenide substrate) usually through a photolithography process and/or other processes. The fabrication environment may produce IC 120, installed on a chip. Verification testing may be performed to determine that the chip is performing in accordance with the specification (e.g., clock skew, clock latency, chip speed, etc.).

While the foregoing operations may be performed during a routing stage of a PDL phase, in other implementations, fewer operations, different operations, additional operations or differently arranged operations may be associated with the routing stage. Furthermore, the manner in which the operations are performed may, in other implementations, be modified from that discussed herein. For example, the order of the operations may be changed, the performance of one or more operations may be repeated, one or more operations may not be performed, and/or one or more operations may be performed in an iterative manner.

Figure 3:
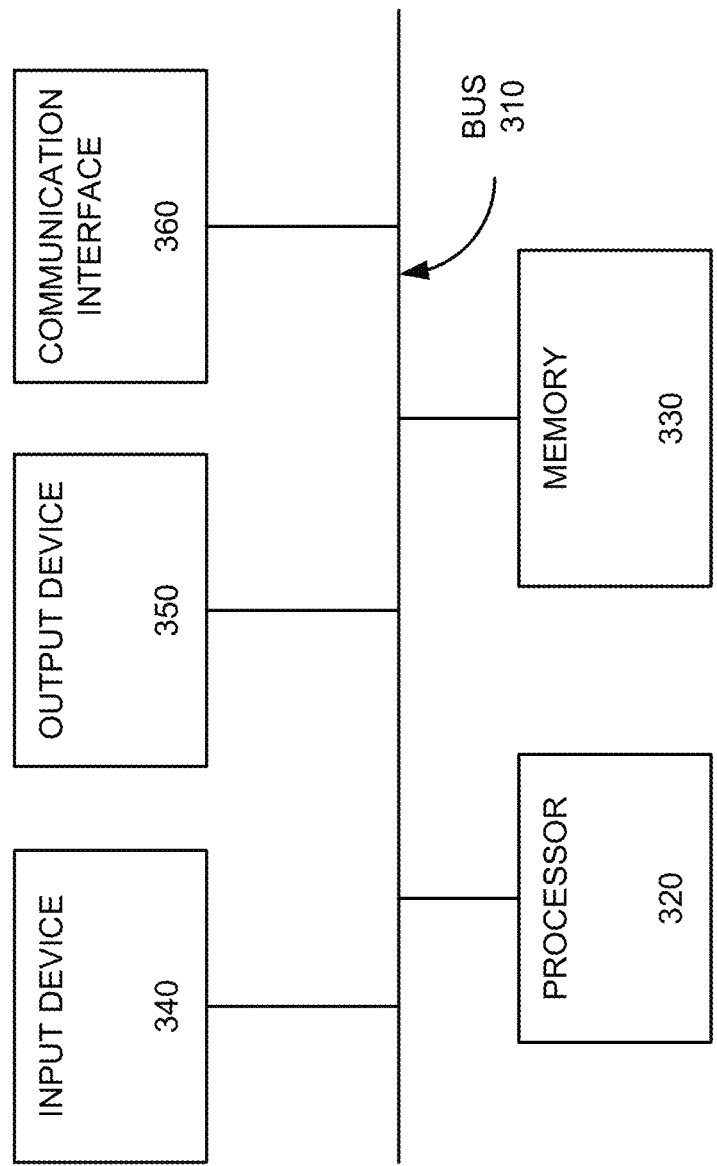
FIG. 3 is a diagram of example components of a device that may be used within the environment of FIG. 2.

FIG. 3 is a diagram of example components of a device 300 that may operate within the environment of FIG. 2. For example, device 300 may correspond to computing device 110. As depicted, device 300 may include bus 310, processor 320, memory 330, input device 340, output device 350, and communication interface 360. However, in other implementations, device 300 may include fewer components, additional components, different components, or differently arranged components than those illustrated in FIG. 3.

Bus 310 may include one or more component subsystems and/or communication paths that enable communication among the components of device 300. Processor 320 may include one or more processors, microprocessors, data processors, co-processors, network processors, application-specific integrated circuits (ASICs), controllers, programmable logic devices (PLDs), chipsets, field-programmable gate arrays (FPGAs), or other types of components that may interpret or execute instructions or data. Processor 320 may control the overall operation, or a portion thereof, of device 300, based on, for example, an operating system and/or various applications. Processor 320 may access instructions from memory 330, from other components of device 300, or from a source external to device 300 (e.g., a network or another device).

Memory 330 may include memory and/or secondary storage. For example, memory 330 may include random access memory (RAM), dynamic RAM (DRAM), read-only memory (ROM), programmable ROM (PROM), flash memory, or some other type of memory. Memory 330 may include a hard disk (e.g., a magnetic disk, an optical disk, a magneto-optic disk, a solid state disk, etc.) or some other type of computer-readable medium, along with a corresponding drive. A computer-readable medium may be defined as a non-transitory memory device. A memory device may include space within a single physical memory device or spread across multiple physical memory devices.

Input device 340 may include one or more components that permit a user to input information into device 300. For example, input device 340 may include a keypad, a button, a switch, a knob, fingerprint recognition logic, retinal scan logic, a web cam, voice recognition logic, a touchpad, an input port, a microphone, a display, or some other type of input component. Output device 350 may include one or more components that permit device 300 to output information to a user. For example, output device 350 may include a display, light-emitting diodes (LEDs), an output port, a speaker, or some other type of output component.

Communication interface 360 may include one or more components that permit device 300 to communicate with other devices or networks. For example, communication interface 360 may include some type of wireless or wired interface. Communication interface 330 may also include an antenna (or a set of antennas) that permit wireless communication, such as the transmission and reception of radio frequency (RF) signals.

As described herein, device 300 may perform certain operations in response to processor 320 executing software instructions contained in a computer-readable medium, such as memory 330. The software instructions may be read into memory 330 from another computer-readable medium or from another device via communication interface 360. The software instructions contained in memory 330 may cause processor 320 to perform one or more processes described herein. Alternatively, hardwired circuitry may be used in place of, or in combination with, software instructions to implement processes described herein. Thus, implementations described herein are not limited to any specific combination of hardware circuitry and software.

Figure 4:
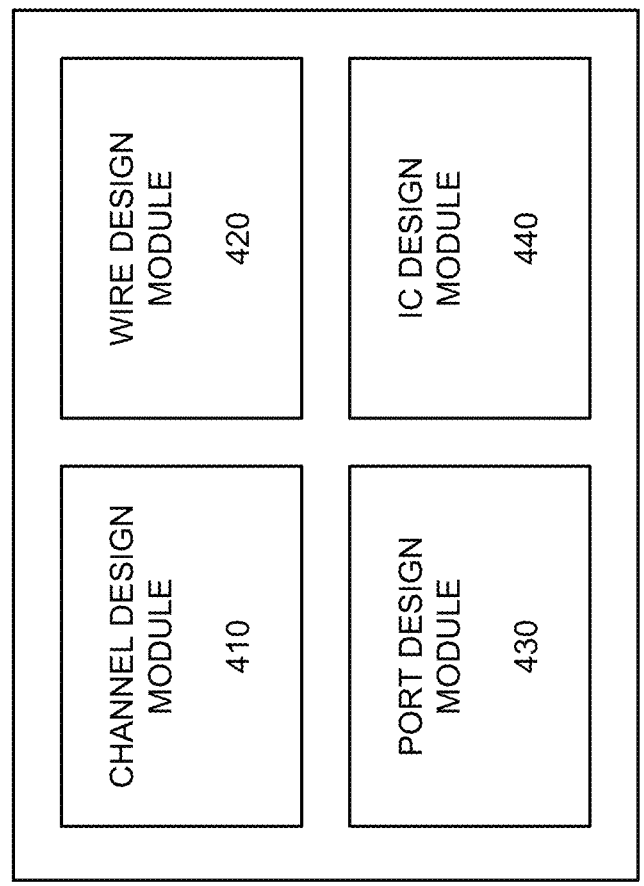
FIG. 4 is a diagram of example functional components of a computing device according to one or more implementations described herein.

FIG. 4 is a diagram of example functional components of computing device 110 according to one or more implementations described herein. As illustrated, computing device 110 may include channel design module 410, wire design module, port design module 430, and IC design module 440. Depending on the implementation, one or more of modules 410-440 may be implemented as a combination of hardware and software based on the components illustrated and described with respect to FIG. 3. Alternatively, modules 410-440 may each be implemented as hardware based on the components illustrated and described with respect to FIG. 3.

Channel design module 410 may provide functionality relating to designing signal channels 140. For example, channel design module 410 may enable computing device 110 to identify one or more signal channels 140 for connecting circuit blocks 130. As mentioned above, signal channel 140 may be implemented by one or more signal wires. A more detailed discussion of signal channels 140 and signal wires is provided below with reference to FIG. 9.

Channel design module 410 may assign a channel priority to signal channels 140 based on one or more channel criteria. Examples of channel criteria may include an estimated use corresponding to a signal channel, a distance between two or more circuit blocks 130, a quantity of signal wires corresponding to one or more signal channels 140, a function associated with one or more signal channels 140, a function associated with one or more circuit blocks 130, a function associated with IC 120, and/or one or more other types of characteristics or components relating to signal channels 140. A more detailed discussion of prioritizing signal channels is provided below with reference to FIG. 7.

Channel design module 410 may allocate channel implementation areas to signal channels 140 based on one or more block implementation areas. Similar to block implementation areas, channel implementation areas may include an area (one dimensional, two dimensional, or three dimensional), relative to substrate 125, that is reserved or otherwise allocated for implementing one or more signal channels 140. In some implementations, channel design module 410 may give priority to block implementation areas over channel implementation areas when determining, defining, and/or allocating channel implementation areas to signal channels 140. Similarly, channel design module 410 may give priority to channel implementation areas that have already been allocated to signal channels (e.g., to signal channels with a higher priority). Additionally, or alternatively, in scenarios where a signal channel may be implemented using various channel implementation areas, channel design module 410 may select the channel implementation area that provides the shortest available path between the relevant circuit blocks 130.

Wire design module 420 may provide functionality relating to designing signal wires. For example, wire design module 420 may enable computing device 110 to identify a quantity of signal wires corresponding to each signal channel 140. Wire design module 420 may also, or alternatively, select a wire pattern for each signal wire. In some implementations, the wire pattern may be selected to equalize a wire length (or a transmission time) associated with each signal wire of a given signal channel.

The wire pattern may also, or alternatively, be based on the channel implementation area allocated to the corresponding signal channel. For example, if the channel implementation area includes a path with a right angle (see, for example, signal channel 140-P of FIG. 1), the wire pattern selected for each signal wire of the corresponding signal channel may also include a path that follows the right angle of the channel implementation area. Wire design module 420 may assign, reserve, or otherwise allocate a wire implementation area for each signal wire of a signal channel.

Port design module 430 may provide functionality relating to designing ports 150. For example, port design module 430 may enable computing device 110 to identify one or more ports 150 (or sets of ports 150) corresponding to a signal wire, a set of signal wires, and/or a signal channel 140. Port design module 430 may also, or alternatively, enable computing device 110 to allocate port implementation areas for one or more ports 150 (or sets of ports 150) corresponding to a signal wire, a set of signal wires, and/or a signal channel 140. Similar to block implementation areas, channel implementation areas, and wire implementation areas, a port implementation area may include an area (e.g., a one dimensional area, a two dimensional area, or a three dimensional area), relative to substrate 125, that is reserved or otherwise allocated for implementing one or more ports 150.

IC design module 440 may provide functionality relating to designing ICs. For example, IC design module 440 may enable computing device 110 to generate an IC design that includes the block implementation areas, channel implementation areas, wire implementation areas, and/or port implementation areas. An IC design may include any variety of information necessary or beneficial to defining IC 120, describing IC 120, and/or manufacturing IC 120.

In addition to the functionality described above, functional components 400 may also, or alternatively, provide functionality as described elsewhere in this specification. While FIG. 4 shows a particular number and arrangement of modules, in alternative implementations, functional components 410-440 may include additional modules, fewer modules, different modules, or differently arranged modules than those depicted.

Figure 5A:
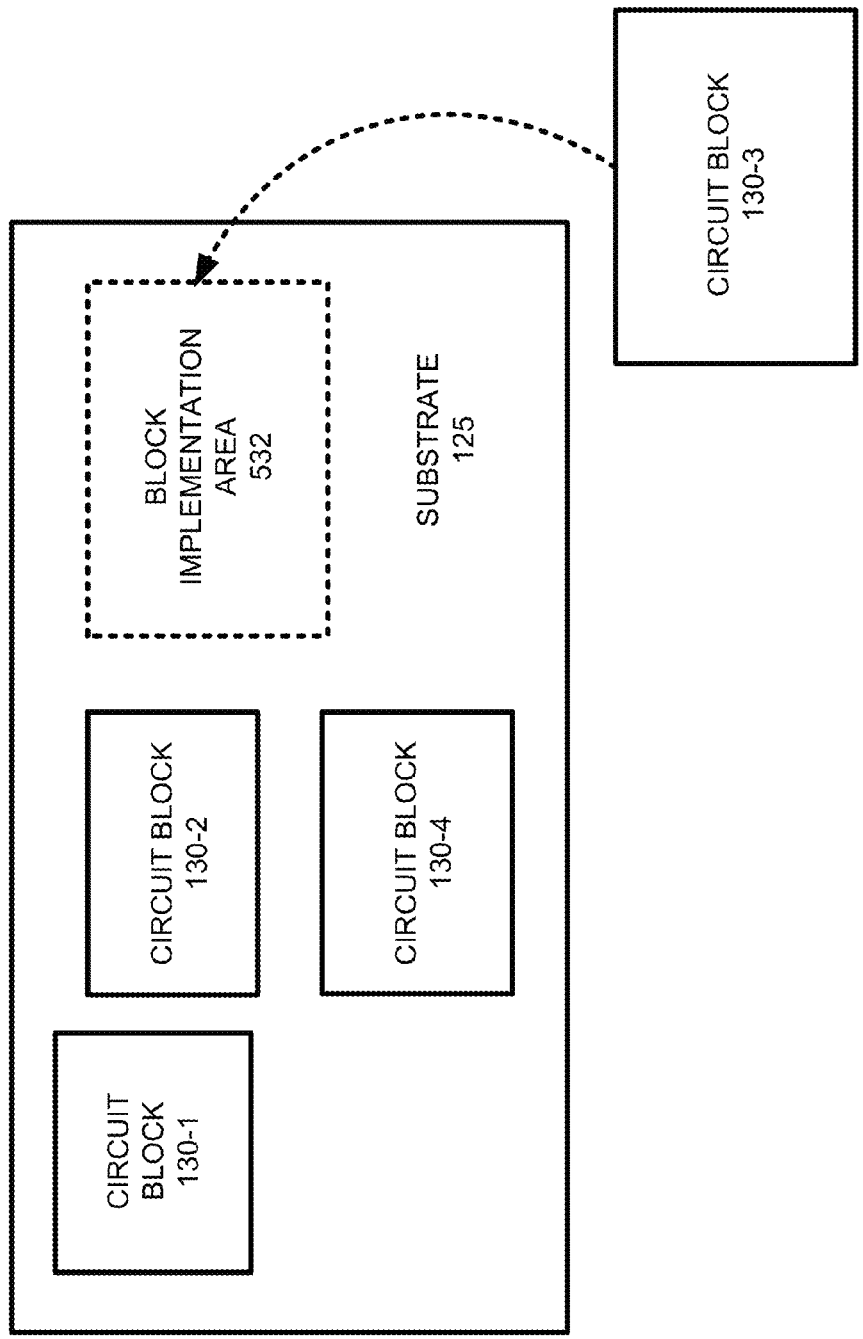

FIG. 5A is a diagram of an IC 120 according to one or more implementations described herein. As depicted, IC 120 may include substrate 125, circuit blocks 130-1, 130-2, 130-3, and 130-4, and block implementation area 532. Substrate 125 and circuit blocks 130 are discussed above with reference to FIG. 1. Block implementation area 532 may include an area, relative to substrate 125, reserved for implementing one or more circuit blocks 130. While in the depicted example of FIG. 5A block implementation area 532 is two dimensional, in other implementations, block implementation area 532 may be three dimensional.

As mentioned above, channel design module 410 may enable computing device 110 to identify one or more signal channels 140 for connecting circuit blocks 130. In some implementations, channel design module 410 may identify signal channels based on information received from another device and/or information provided by a user of computing device 110 (e.g., design information of IC 120, function information of IC 120, design information of circuit block 130, function information of circuit blocks 130, etc.). Additionally, or alternatively, computing device 110 may perform one or more logical operations to identify signal channels 140 for connecting circuit blocks 130. For example, computing device 110 may identify signal channels 140 for connecting circuit blocks 130 by determining a function of IC 120, determining a function of each circuit blocks 130, and deriving or otherwise defining one or more signal channels 140 based on the function of IC 120 and/or the functions of circuit blocks 130.

FIG. 5B is a diagram of an IC 120 according to one or more implementations described herein. As depicted, IC 120 may include substrate 125, circuit blocks 130-1, 130-2, 130-3, and 130-4, signal channels 140-1 and 140-2, and channel implementation area 542. Similar to block implementation area 532 described above with reference to FIG. 5A, channel implementation area 542 may include an area, relative to substrate 125, reserved for implementing signal channel 140. While in the depicted example of FIG. 5B channel implementation area 542 is two dimensional, in other implementations, channel implementation area 542 may be one dimensional, two dimensional, or three dimensional.

Figure 5C:
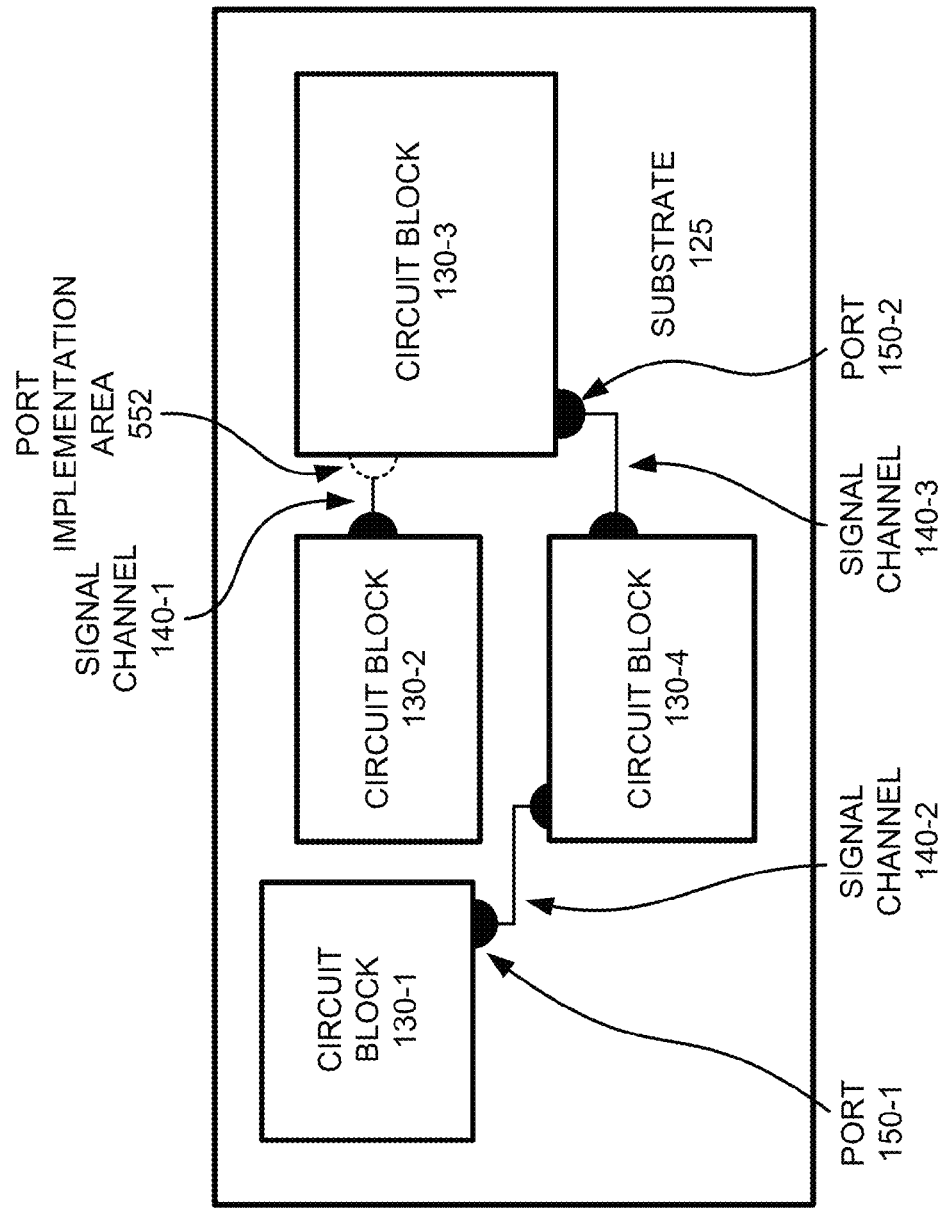

FIG. 5C is a diagram of an IC 120 according to one or more implementations described herein. As depicted, IC 120 may include substrate 125, circuit blocks 130-1, 130-2, 130-3, and 130-4, signal channels 140-1, 140-2, and 140-3, ports 150-1 and 150-2, and port implementation area 552. Similar to channel implementation area 542 described above with reference to FIG. 5B, port implementation area 552 may include an area, relative to substrate 125, reserved for implementing port 150. While in the depicted example of FIG. 5C port implementation area 552 is two dimensional, in other implementations, port implementation area 552 may be three dimensional.

Figure 6:
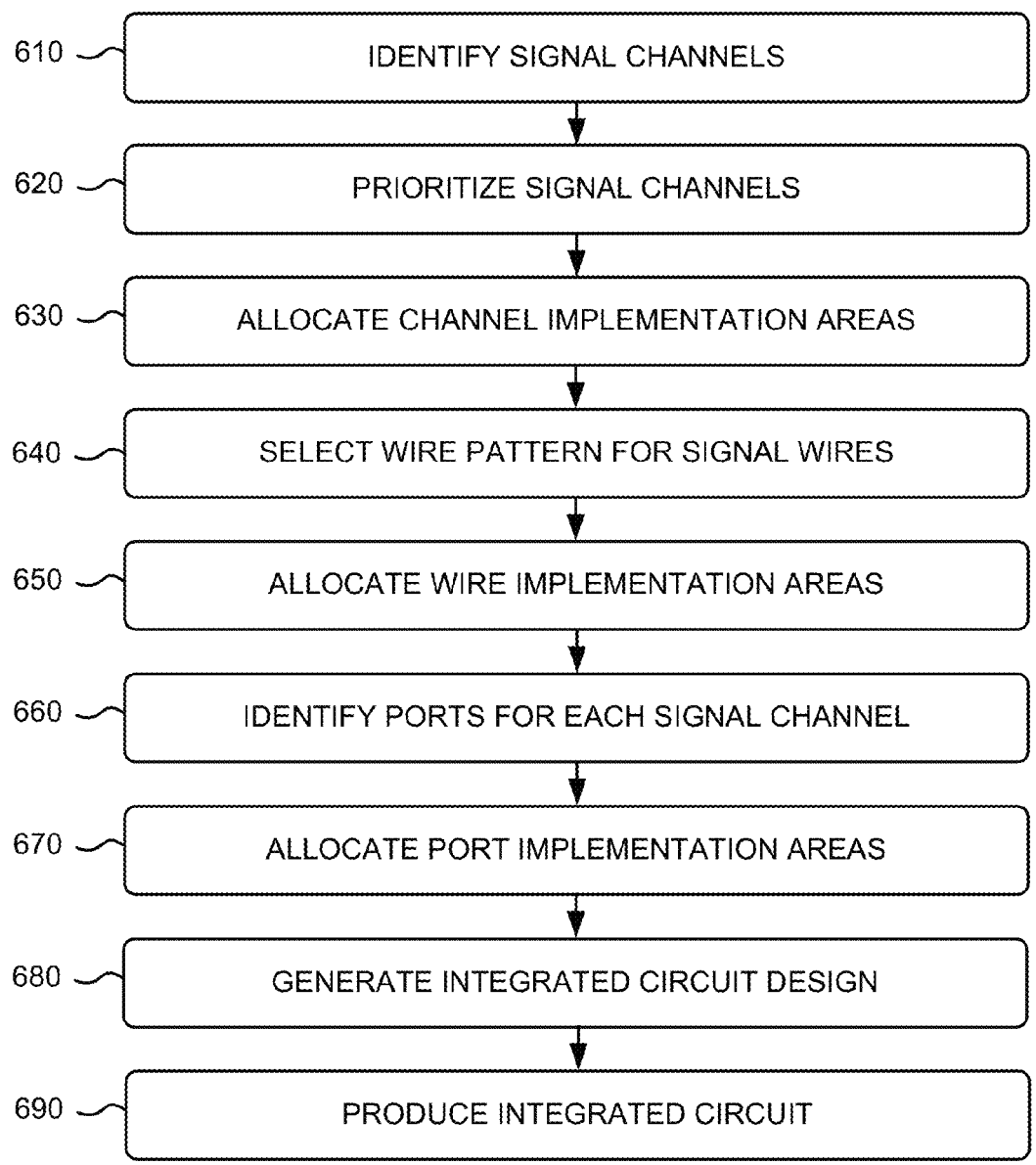
FIG. 6 is a diagram of an example process for producing an integrated circuit according to one or more implementations described herein.

FIG. 6 is a diagram of an example process 600 for producing an IC 120 according to one or more implementations described herein. In one or more implementations, process 600 may be performed by one or more components of computing device 110. In other implementations, one or more blocks of process 600 may be performed by one or more other components/devices, or a group of components/devices, including or excluding computing device 110.

Signal channels may be identified (block 610). For example, computing device 110 may identify one or more signal channels 140 for connecting circuit blocks 130. In some implementations, each circuit block 130 may be associated with a different block implementation area 532. In certain implementations, computing device 110 may assign, reassign, arrange, or rearrange circuit blocks 130 with respect to substrate 125 and/or with respect to other circuit blocks 130. In other implementations, computing device 110 may receive IC configuration data that specifies, identifies, or otherwise defines substrate 125, one or more circuit blocks 130, and/or a block implementation area 532 corresponding to each circuit block 130.

Signal channels may be prioritized (block 620). For example, computing device 110 may assign a channel priority to each of the signal channels based on one or more channel criteria. As mentioned above, examples of channel criteria may include an estimated use corresponding to a signal channel, a distance between two or more circuit blocks 130, a quantity of signal wires corresponding to one or more signal channels 140, a function associated with one or more signal channels 140, a function associated with one or more circuit blocks 130, a function associated with IC 120, and/or one or more other types of characteristics or components relating to signal channels 140. A more detailed discussion of prioritizing signal channels is provided below with reference to FIG. 7.

Channel implementation areas may be allocated (block 630). For example, computing device 110 may allocate channel implementation areas 542 for signal channels 140. In some implementations, computing device 110 may allocate channel implementation areas 542 in a sequential manner, starting with high-priority signal channels 140 and ending with low-priority signal channels 140. In some implementations, computing device 110 may allocate channel implementation areas 542 using one or more channel patterns, or sets of channel patterns. A more detailed discussion of using channel patterns to allocate channel implementation areas is provided below with reference to FIG. 8.

Wire patterns for signal wires may be selected (block 640). For example, computing device 110 may select a wire pattern for each signal wire corresponding to signal channel 140. In some implementations, the wire pattern selected may be similar, or otherwise complementary, to channel implementation area 532 allocated to a corresponding signal channel 140. A more detailed discussion of selecting wire patterns for signal wires is provided below with reference to FIG. 9.

Wire implementation areas may be allocated (block 650). For example, computing device 110 may allocate a wire implementation area for each signal wire corresponding to signal channel 140. Similar to channel implementation area 542, a wire implementation area may include an area (e.g., a one dimensional area, a two dimensional area, or a three dimensional area), relative to substrate 125, that is reserved or otherwise allocated for implementing one or more signal wires. The quantity of signal wires corresponding to a given signal channel may vary.

Ports for each signal channel may be identified (block 660). For example, computing device 110 may identify one or more ports 150 connecting circuit block 130 and signal channel 140. In some implementations, computing device 110 may identify ports 150 based on corresponding circuit blocks 130, corresponding signal channels 140, and/or corresponding signal wires.

Port implementation areas may be allocated (block 670). For example, computing device 110 may reserve or otherwise allocate a port implementation area 552 for each port corresponding to signal channel 140. Similar to a wire implementation area, port implementation area 552 may include an area (e.g., a one dimensional area, a two dimensional area, or a three dimensional area), relative to substrate 125, that is reserved or otherwise allocated for implementing one or more ports.

An integrated circuit design may be generated (block 680). For example, computing device 110 may generate an IC design that includes the block implementation areas 532, channel implementation areas 542, wire implementation areas, and/or port implementation areas 552. Additionally, or alternatively, an IC design may be used to produce an IC (block 690). For example, a known IC fabrication process may be used to generate or otherwise fabricate one or more integrated circuits in accordance with the integrated circuit design.

While FIG. 6 shows a flowchart diagram of an example process 600 for producing an IC, in other implementations, a process for producing an IC may include fewer operations, different operations, differently arranged operations, or additional operations than depicted in FIG. 6.

FIG. 7 is a diagram of an example data structure 700 for prioritizing signal channels according to one or more implementations described herein. As depicted, table 700 may include a column identifying signal channels 140, a column for rating a functional priority of each signal channel 140, a column for rating a use priority corresponding to each signal channel 140, and a column for assigning an overall priority to each signal channel 140. In one or more implementations, table 700 may represent a process for prioritizing signal channels 140, which may be performed by one or more components of computing device 110. In other implementations, table 700 may represent a process for prioritizing signal channels 140, which may be performed by one or more other components/devices of computing device 110, or a group of components/devices, including or excluding computing device 110.

In the depicted example, each signal channel 140 is represented as a connection (e.g., an arrow) between two circuit blocks 130. In other implementations, signal channel 140 may be represented or identified in another manner. Additionally, or alternatively, signal channels 140 may be evaluated according to one or more channel criteria. A functional priority of each signal channel 140 may be based on an evaluation of how significant a function provided by, or facilitated by, a particular signal channel 140 is to an overall function corresponding to IC 120. A use priority of each signal channel 140 may be based on an evaluation of an estimated use corresponding to signal channel 140 (e.g., an evaluation of how frequently and to what extent a particular signal channel will be used).

An overall priority of signal channel 140 may be based on a combination of individual priority ratings (e.g., a functional priority, a use priority, etc.), which may be weighted depending on the implementation. For example, a functional priority rating may have a greater impact on the overall priority rating than a use priority rating. In other implementations, additional, or alternative, channel criteria may be used, such as a distance between two or more circuit blocks 130, a quantity of signal wires corresponding to one or more signal channels 140, a function associated with one or more circuit blocks 130, a function associated with IC 120, and/or one or more other types of channel criteria.

While FIG. 7 shows a table 700 with a particular number and arrangement of attributes (e.g., rows, columns, cells, etc.), in alternative implementations, a table for prioritizing signal channels may include additional attributes, fewer attributes, different attributes, or differently arranged attributes than those depicted.

FIG. 8 is a diagram of example channel patterns 800 according to one or more implementations described herein. As depicted, channel patterns 800 may include one or more two-point channel patterns 810, one or more three-point channel patterns 820, and one or more four-point channel patterns 830. In the depicted example, the letter "A" may represent one circuit block 130, the letter "B" may represent another circuit block 130, and the line between circuit block A and circuit block B may represent a signal channel.

In some implementations, computing device 110 may identify a shortest available path between two or more circuit blocks 130 using one or more of channel patterns 800. For example, computing device 110 may determine whether signal channel 140 may be implemented using one or more two-point channel patterns 810. If signal channel 140 cannot be implemented using any two-point channel patterns 810, computing device 110 may determine whether signal channel 140 may be implemented using one or more three-point channel patterns 820. If signal channel 140 cannot be implemented using any three-point channel patterns 820, computing device 110 may determine whether signal channel 140 may be implemented using one or more four-point channel patterns 800. In some implementations, computing device 110 may continue considering more and more complex channel patterns 830 until computing device 110 identifies a channel pattern that may be used to implement signal channel 140.

While FIG. 8 shows a diagram of example channel patterns 800, in alternative implementations, channel patterns may include additional channel patterns, fewer channel patterns, different channel patterns, or differently arranged channel patterns than those depicted.

FIG. 9 is a diagram of example signal channel 900 according to one or more implementations described herein. As depicted, signal channel 900 may include channel implementation area 942 and signal wires 910-1, 910-2, ..., 910-T (where T≥1) (hereinafter referred to collectively as "signal wires 910" and individually as "signal wire 910"). Signal channel 900 provides an example of wire patterns selected for signal wires 910 of a signal channel 140.

As mentioned above, computing device 110 may select a wire pattern for each signal wire 910 corresponding to signal channel 140. The wire pattern may be selected to equalize a wire length (or a transmission time) associated with each signal wire or a given signal channel. For instance, in the depicted example of FIG. 9, signal wires 910 are each arranged in a manner consistent with channel implementation area 942; however, signal wires 910 are staggered with respect to one another such that the length of each signal wire 910 is the same, which may equalize a transmission time associated with each signal wire 910.

While FIG. 9 shows a diagram of an example signal channel 900, in alternative implementations, signal channels may include additional wire patterns, fewer wire patterns, different wire patterns, or differently arranged wire patterns than those depicted.

In light of the above, in one or more implementations, systems and devices may be used to design and manufacture ICs with enhanced performance reliability and efficiency. For instance, computing device 110 may identify signal channels 140 for connecting circuit blocks 130 that are associated with block implementation areas 532. Computing device 110 may allocate a channel implementation area 542 (e.g., a shortest available path) for each signal channel 140, based on the block implementation areas and any previously allocated channel implementation areas.

Computing device 110 may allocate a wire implementation area for each signal wire, based on the channel implementation area previously allocated to the corresponding signal channel 140, to equalize a transmission time associated with each signal wire. Computing device 110 may also, or alternatively, identify one or more sets of ports 150 corresponding to each signal channel 140 or set of signal wires, and allocate port implementation areas 552 for each of the identified ports 150. Computing device 110 may generate an IC design that includes the block implementation areas 532, channel implementation areas 542, wire implementation areas, and/or port implementation areas 552. One or more of the implementations, described herein, includes an automated, crosstalk aware, full chip routing solution for high-performance, complex ASICS.

It will be apparent that example aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

Further, certain implementations may involve a component that performs one or more functions. These components may include hardware, such as an ASIC or a FPGA, or a combination of hardware and software.

Even though particular combinations of features are recited in the claims and/or disclosed in the specification, these combinations are not intended to limit disclosure of the possible implementations. In fact, many of these features may be combined in ways not specifically recited in the claims and/or disclosed in the specification. Although each dependent claim listed below may directly depend on only one other claim, the disclosure of the implementations includes each dependent claim in combination with every other claim in the claim set.

No element, act, or instruction used in the present application should be construed as critical or essential to the disclosed implementations unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A system comprising:
   a device to:
      allocate, for a signal channel, a channel implementation area of a substrate,
         the signal channel connecting circuit blocks of the substrate;
      select a wire pattern for signal wires,
         the signal wires being associated with the signal channel,
         the wire pattern being selected based on the signal wires;
      allocate, based on the wire pattern, a wire implementation area, of the substrate, for each signal wire of the signal wires; and
      generate an integrated circuit design,
         the integrated circuit design comprising:
            the channel implementation area, and
            the wire implementation area allocated for each signal wire of the signal wires.

2. The system of claim 1, where the device is further to:
   allocate another channel implementation area, of the substrate, for another signal channel,
   where the integrated circuit design further comprises the other channel implementation area.

3. The system of claim 2, where the device is further to:
   assign a first channel priority to the signal channel; and
   assign a second channel priority to the other signal channel,
   where the first channel priority is higher than the second channel priority, and
   where the channel implementation area is allocated for the signal channel prior to the other channel implementation area being allocated for the other signal channel based on the first channel priority being higher than the second channel priority.

4. The system of claim 2, where the other channel implementation area is allocated based on the channel implementation area.

5. The system of claim 1, where the device is further to:
   identify one or more ports corresponding to the signal channel; and
   allocate one or more port implementation areas for the one or more ports, and
   where the integrated circuit design further comprises the one or more port implementation areas.

6. The system of claim 1, where each circuit block, of the circuit blocks, is associated with a circuit block implementation area relative to the substrate, and
   where the integrated circuit design further comprises the circuit block implementation area associated with each circuit block of the circuit blocks.

7. The system of claim 6, where the channel implementation area includes a shortest available path out of available paths between the circuit block implementation area associated with each circuit block of the circuit blocks.

8. The system of claim 1, where the device is further to:
   identify the signal channel based on at least one of:
      a function of an integrated circuit associated with the integrated circuit design, or
      a function of the circuit blocks.

9. A method comprising:
   allocating, by a device and for a signal channel, a channel implementation area of a substrate,
      the signal channel connecting circuit blocks of the substrate;
   selecting, by the device, a wire pattern for signal wires,
      the signal wires being associated with the signal channel,
      the wire pattern being selected based on the signal wires;
   allocating, by the device and based on the wire pattern, a wire implementation area, of the substrate, for each signal wire of the signal wires; and
   generating, by the device, an integrated circuit design,
      the integrated circuit design comprising:
         the channel implementation area, and
         the wire implementation area allocated for each signal wire of the signal wires.

10. The method of claim 9, further comprising:
determining a function of an integrated circuit associated with the integrated circuit design;
determining a function of the circuit blocks; and
identifying the signal channel based on at least one of:
the function of the integrated circuit, or
the function of the circuit blocks.

11. The method of claim 9, further comprising:
assigning a first channel priority to the signal channel based on:
an estimated use corresponding to the signal channel, and
a function provided by or facilitated by the signal channel.

12. The method of claim 11, further comprising:
assigning a second channel priority to another signal channel,
where the first channel priority is higher than the second channel priority.

13. The method of claim 12, further comprising:
allocating another channel implementation area, of the substrate, for the other signal channel,
where the integrated circuit design further comprises the other channel implementation area, and
where the channel implementation area is allocated for the signal channel prior to the other channel implementation area being allocated for the other signal channel based on the first channel priority being higher than the second channel priority.

14. The method of claim 9, further comprising:
identifying ports corresponding to the signal channel; and
allocating port implementation areas for the ports,
where the integrated circuit design further comprises the port implementation areas.

15. The method of claim 9, where each circuit block, of the circuit blocks, is associated with a circuit block implementation area relative to the substrate, and
where the integrated circuit design further comprises the circuit block implementation area associated with each circuit block of the circuit blocks.

16. The method of claim 9, further comprising:
allocating another channel implementation area, of the substrate, for another signal channel,
where the other channel implementation area is allocated based on the channel implementation area.

17. A non-transitory computer-readable medium storing instructions, the instructions comprising:
a plurality of instructions which, when executed by a device, cause the device to:
allocate, for a signal channel, a channel implementation area of a substrate,
the signal channel connecting circuit blocks of the substrate;
select a wire pattern for signal wires,
the signal wires being associated with the signal channel,
the wire pattern being selected based on the signal wires;
allocate, based on the wire pattern, a wire implementation area, of the substrate, for each signal wire of the signal wires; and
generate an integrated circuit design,
the integrated circuit design comprising:
the channel implementation area, and
the wire implementation area allocated for each signal wire of the signal wires.

18. The non-transitory computer-readable medium of claim 17, where each circuit block, of the circuit blocks, is associated with a circuit block implementation area relative to the substrate, and
where the integrated circuit design further comprises the circuit block implementation area associated with each circuit block of the circuit blocks.

19. The non-transitory computer-readable medium of claim 17, where the instructions further comprise:
one or more instructions to allocate another channel implementation area, of the substrate, for another signal channel,
where the other channel implementation area is allocated based on the channel implementation area, and
where the integrated circuit design further comprises the other channel implementation area.

20. The non-transitory computer-readable medium of claim 17, where the instructions further comprise:
one or more instructions to identify the signal channel based on at least one of:
a function of an integrated circuit associated with the integrated circuit design, or
a function of the circuit blocks.

* * * * *